United States Patent [19]

Welch et al.

[11] Patent Number: 4,753,709

[45] Date of Patent: Jun. 28, 1988

[54] METHOD FOR ETCHING CONTACT VIAS IN A SEMICONDUCTOR DEVICE

[75] Inventors: Michael T. Welch, Sugar Land; Ronald E. McMann, Rosenberg; Manuel L. Torreno, Jr., Houston; Evaristo Garcia, Jr., Rosenberg; Jeffrey E. Brighton, Katy, all of Tex.

[73] Assignee: Texas Instruments Incorporated, Dallas, Tex.

[21] Appl. No.: 11,072

[22] Filed: Feb. 5, 1987

[51] Int. Cl.$^4$ .................. H01L 21/306; B44C 1/22; C03C 15/00; C23F 1/02

[52] U.S. Cl. .................. 156/643; 156/644; 156/646; 156/653; 156/656; 156/657; 156/659.1; 156/662; 357/43; 357/59; 357/67; 357/71; 437/31; 437/192; 437/200; 437/228

[58] Field of Search .............. 156/643, 644, 646, 653, 156/656, 657, 659.1, 661.1, 662; 148/1.5, 187; 29/571, 576 W, 578, 580, 591; 204/192.32, 192.37; 427/88-91, 93; 357/34, 43, 49, 58, 59, 67, 71; 437/31-33, 39, 192, 200, 228, 233, 235, 245

[56] References Cited

U.S. PATENT DOCUMENTS

| | | | |
|---|---|---|---|
| 4,107,726 | 8/1978 | Schilling | 357/71 |
| 4,436,582 | 3/1984 | Saxena | 156/656 |
| 4,466,172 | 8/1984 | Batra | 156/653 X |
| 4,477,310 | 10/1984 | Park et al. | 29/571 X |
| 4,507,847 | 4/1985 | Sullivan | 29/571 X |
| 4,566,175 | 1/1986 | Smayling et al. | 29/571 X |
| 4,589,928 | 5/1986 | Dalton et al. | 29/578 |

Primary Examiner—William A. Powell

Attorney, Agent, or Firm—Larry C. Schroeder; James T. Comfort; Melvin Sharp

[57] ABSTRACT

A method for forming contact vias in order to make electrical connection between conductive interconnection layers is disclosed. The semiconductor slice is processed so as to form the diffusions and underlying interconnection layers using well known techniques. After the deposition and patterning of the last interconnection layer prior to metallization, a layer of platinum or another metal is deposited onto the slice. The slice is sintered to form a silicide film on those portions of the interconnection layers and diffusions which were directly exposed to the sputtered platinum. A layer of phosphorous-doped dielectric is then deposited, followed by a layer of undoped oxide. Photoresist or another conformal material is spun on to the slice, resulting in a planar top surface. The slice is exposed to a plasma etch which etches both the photoresist and the undoped oxide, resulting in a top surface of the undoped oxide which is substantially planar. Contact vias are etched through the undoped and doped oxides; the silicide film acts as an etch stop, allowing contacts of differing depths to be etched from the planar top surface of the undoped oxide without etching through any of the polysilicon layers to which contact is to be made. A metal such as tungsten is deposited onto the slice to fill the contact vias, and is planarized in the same fashion as was the undoped oxide. The metallization is then sputtered onto the planar surface presented by the planarized undoped oxide and the planarized tungsten, and is patterned and etched to form the desired interconnection pattern.

17 Claims, 5 Drawing Sheets

METHOD FOR ETCHING CONTACT VIAS IN A SEMICONDUCTOR DEVICE

This application is related to application Ser. No. 10,937, filed Feb. 5, 1987.

The present invention relates to a method of fabrication of an integrated circuit. More specifically, the present invention provides a method for etching contact vias through a dielectric film in the fabrication of a semiconductor device.

BACKGROUND OF THE INVENTION

Modern integrated circuits utilize multiple layers of conductive material in the realization of the desired electronic circuit function. These layers often include diffusion regions, in the semiconductor substrate, one or more layers of polysilicon interconnection, and a top metallization layer consisting of aluminum or an aluminum alloy. Because of the presence of these underlying conductive layers and also of the presence of isolation oxide in selected areas of the integrated circuit, the metallization layer generally must be deposited on a surface which has far from a planar topology, requiring each metal line to make steps over various topological features in order to carry current from one area of the device to another. A example of a worst case step could require a metal line to make a step over a coincident edge of two layers of polysilicon and an edge of a field oxide isolation layer. Furthermore, the metal lines must be connected to other conductive layers in order for the circuit to be capable of functionality: this may require a contact from the top metal line, over the two underlying polysilicon layers, all the way to a diffusion. The ability of a metallization layer to reliably cover steps, and to reliably make contacts, can be the limiting factors in the layout of an integrated circuit.

Currently, metallization layers are either evaporated or sputtered onto the surface of the semiconductor slice. Relative to the problem of step coverage, if a step to be made by the metal line (either evaporated or sputtered) is too steep, the deposited metal line may be broken over the step, causing the integrated circuit to be non-functional. Even for those circuits which function, the metal line is likely to be thinner in the location of the step than elsewhere in the circuit. It is well known that aluminum and aluminum-alloy metal lines are prone to electromigration failures within the useful life of the circuit if the current density is above a certain limit; the presence of steps which are too steep for the metallization technology will, due to the thinning over the step, provide sites for electromigration failures. Accordingly, from a yield and reliability standpoint, the steepness of the steps required of a metal line should be minimized.

Contact between a metal line and underlying layers is often made by way of etching holes in the oxide layer upon which the metal will be deposited, prior to metal deposition. These holes must open to the underlying layer to which connection is desired, whether diffusion, polysilicon, or both. Of course, the smaller the size of the contact, less surface area is required for the silicon realization of the circuit, not only for the contact area itself, but also to provide a safe area around the contact to prevent shorting of the metal line to a polysilicon line to which connection is not desired. However, as contacts are made smaller, the likelihood that the metallization may not completely fill the contact via and make good ohmic contact increases. In addition, since contact to different underlying layers is required, difficulty in controlling the etch of the oxide layer exists, since the time to etch to a diffusion will necessarily be longer than the time required to etch to a polysilicon layer above the surface of the slice. Tight process control is thus required in order to both allow contact to the diffusion and also to prevent the polysilicon contacts from becoming too large ("blowing out"). While an etch process may be used which will make the walls of the contact substantially vertical, the etch may also etch through the polysilicon of the upper layer before making contact to a lower layer such as a diffusion. In addition, using only an evaporation or sputtering of the metal layer after contact etch, a vertical walled contact may cause thinning and breaking problems as discussed above relative to step coverage may also occur in the contact via.

The engineer responsible for layout of the integrated circuit on silicon is thus given a number of restrictions in the routing of the metallization. For example, a minimum distance between an edge of first polysilicon and an edge of second polysilicon may be required to be maintained, which allows the metal line to be required to only make one step at a time. In addition, a minimum metal line width may be required in order for the current density of the metal line to be below the threshold limit for electromigration purposes, with the thinning effect of the metal as it makes a step taken into account. Since the thinning of the metal line over a step can be more than 50%, the metal line width will need to be widened accordingly by more than 50% to account for its thinning over the step. Relative to contacts, the layout engineer must keep unrelated polysilicon a minimum distance away from each contact via, while maintaining a reliable minimum contact size. Each of these minimum size and distance requirements cause the size of the silicon area necessary for the layout of the integrated circuit to increase, reducing the number of circuits on a given semiconductor slice, and increasing the cost of each circuit.

It is therefore an object of this invention to provide a process for manufacturing an integrated circuit which allows the etching of contact vias of differing depths to make electrical connection between a metallization interconnection layer and various underlying conductive layers.

It is a further object of this invention to provide such a process while also providing uniformly sized contacts of different depths.

It is a further object of this invention to provide such a process which provides for etching of contact vias with substantially vertical sidewalls.

It is a further object of this invention to provide such a process by using a silicide film which is self-aligning when formed on a plurality of conductive layers.

Other objects of the invention will be apparent to those skilled in the art, and having reference to this specification.

SUMMARY OF THE INVENTION

The invention may be incorporated in an integrated circuit formed on a semiconductor slice, in which electrical contact is necessary between an upper metallization layer and a lower conductive interconnection layer, separated by a film of insulating dielectrics. Exposed portions of the lower layer, to which contact is desired, are coated with a silicide film. Dielectric material is deposited on the surface of the slice. Photoresist is spun on the slice, and the slice is etched so that the photoresist, and some of the underlying dielectric, is removed; the surface of the underlying dielectric layer after this etch is significantly more planar than after its deposition. Contact vias are etched with the silicide film acting as an etch stop, allowing contacts of different depths to be etched. A refractory metal film and an aluminum film are deposited, patterned and etched, to form the metallization interconnection pattern and to make contact to the underlying layer.

DETAILED DESCRIPTION OF THE PREFERRED EMBODIMENT

Figure 1:
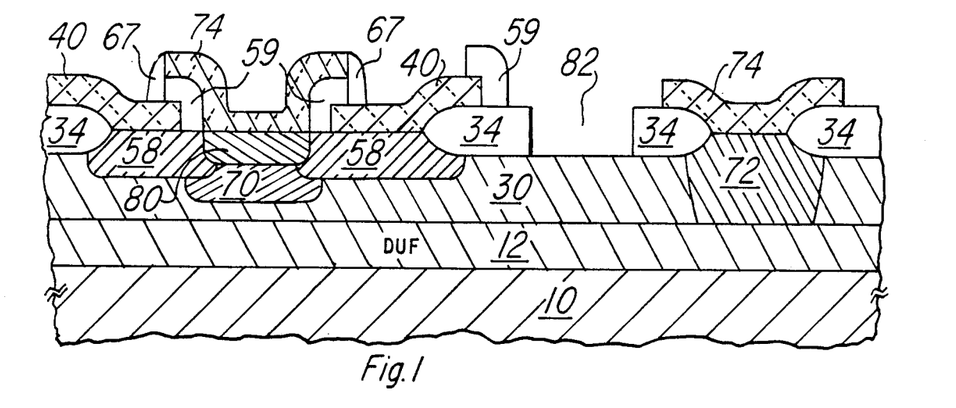
FIG. 1 is a cross-sectional view of a partially-fabricated n-p-n bipolar transistor to be processed according to the invention.

Referring to FIG. 1, a cross-section of a partially-fabricated n-p-n bipolar transistor which can utilize the process according to the invention is shown. The construction of the transistor of FIG. 1 up to this point is described in copending application Ser. No. 824,388 filed on Jan. 30, 1986, and assigned to Texas Instruments Incorporated, now abandoned. In summary, the transistor structure of FIG. 1 consists of n-type diffusion under field (DUF) 12 diffused into p-type substrate 10. N-type epitaxial layer 30 covers DUF 12, and will serve as part of the collector region. Isolation trenches (not shown) may be used to separate active components from one another on the same semiconductor chip; said copending application Ser. No. 824,388 describes the fabrication and operation of these trenches. Field oxide 34 is grown for surface isolation among p-type base diffusion 58, Schottky barrier diode region 82, and n-type collector diffusion 72. As discussed in said copending application Ser. No. 824,388, extrinsic base regions 58 are formed by a diffusion step occurring after the deposition and patterning of p-type polycrystalline (or amorphous) silicon 40: intrinsic base region 70 is formed by a boron implant and subsequent diffusion. Interlevel oxide 59 is deposited by chemical vapor deposition for isolation of first polysilicon 40 from second polysilicon 74 in areas where the two layers will overlap; interlevel oxide is also patterned and etched to expose a portion of intrinsic base region 70, for formation of emitter region 80. N-type doped polysilicon 74 is deposited and patterned to form interconnection to emitter region 80 and collector region 72. Emitter region 80 is formed by diffusion of the n-type dopant (phosphorous or arsenic) from polysilicon 74 into intrinsic base region 70. After the patterning and removal of polysilicon 74, sidewall spacer oxide 67 is deposited, patterned and etched as is well known in the art (e.g., as described in U.S. Pat. No. 4,566,175, assigned to Texas Instruments, Inc.) to ensure electrical isolation between the edge of second polysilicon 74 and first polysilicon 40 after subsequent processing. Field oxide 34 is also patterned and etched to expose area 82 of epitaxial layer 30; a Schottky barrier diode will be formed in area 82 in a manner described below.

Figure 2:
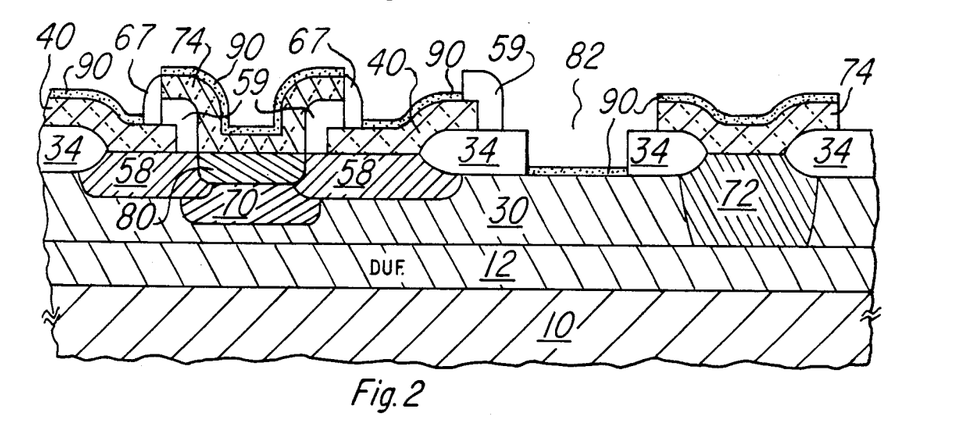
FIG. 2 is a cross-sectional view of the transistor of FIG. 1. after reaction to form a silicide film.

At the point in the fabrication process of the transistor illustrated in FIG. 1, first polysilicon layer 40 and second polysilicon layer 74 are exposed in certain areas. It is well known that the resistance of the interconnection lines is a factor in the operating speed of integrated circuits. It is also well known that the use of silicide film cladding on the polysilicon interconnect lines will provide a low resistance path along the length of the interconnect line. Referring now to FIG. 2, the transistor fabricated according to the invention is now shown with a silicide layer 90 covering the exposed portions of first polysilicon 40 and second polysilicon 74. In the preferred embodiment of the invention, the silicide is platinum silicide formed by direct reaction of platinum with the polysilicon layers 40 and 74. A thin film of the desired silicide metal is deposited on the surface of the slice; in the preferred embodiment, approximately 350 angstroms of platinum is sputtered onto the surface of the slice by well known techniques. Other metals, such as titanium or palladium, may also be used to form the silicide cladding of polysilicon layers 40 and 74 (and of exposed portion 82 of epitaxial layer 30, as will be explained below). The slice is then sintered at a high temperature to form the platinum silicide film 90 in the areas where the deposited metal contacts silicon. In the preferred embodiment, the sintering is at approximately 480 degrees Celsius for 10 minutes in a nitrogen atmosphere, and for approximately 20 minutes in air, resulting in a platinum silicide film of approximately 300 angstroms. Unreacted platinum may then be removed by an aqua regla cleanup. The air "backfill" in the sintering process forms a thin layer of silicon dioxide at the surface of silicide film 90, which protects silicide film 90 from the aqua regia cleanup.

As is evident from FIG. 2, no silicide film 90 forms in locations covered by oxide. Sidewall spacer oxide 67 therefore allows the siliciding of first polysilicon 40 and second polysilicon 74 to be "self-aligned", i.e., no photolithography steps are required to prevent shorting of silicide film 90 on first polysilicon 40 to silicide film 90 on second polysilicon 74. Since the platinum does not react with silicon in those areas where it is deposited on oxide, including sidewall spacer oxide 67, silicide film 90 forms on as much of first polysilicon 40 and second polysilicon 72 as possible, while still preventing shorting between the two conductive layers.

FIG. 2 shows area 82 of epitaxial layer 30 exposed at the surface of the slice. This area 82 is exposed by well known methods of patterning and etching through field oxide 34, and may be done at any time prior to the deposition of platinum. This exposed area 82 will be the location of a Schottky barrier diode, which is formed at the same time that the polysilicon layers 40 and 74 are silicided. During the sinter, silicon in area 82 reacts with the sputtered platinum film in the same manner as polysilicon layers 40 and 74. The Schottky barrier diode at area 82 will be subsequently connected to the base electrode (e.g., polysilicon 40), connecting the Schottky barrier diode between base and collector. As will be discussed below, the silicide cladding of the polysilicon interconnection layers and the Schottky barrier diode will also serve as an etch stop in the formation of the contact vias.

Figure 3:
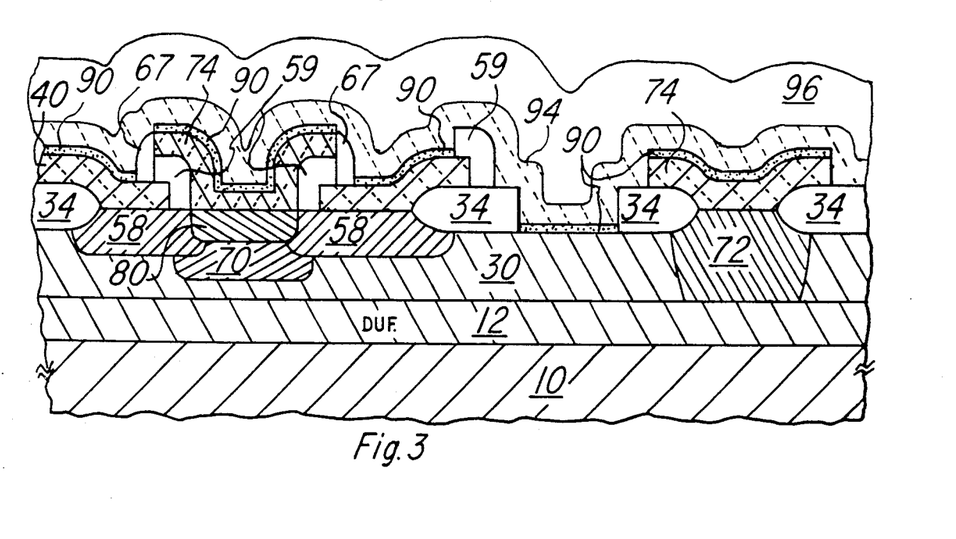
FIG. 3 is a cross-sectional view of the transistor of FIG. 2, after deposition of phosphorous-doped silicon dioxide.

Referring now to FIG. 3, after the cladding of the interconnection layers and Schottky barrier diode, a layer of phosphorous doped silicon dioxide (PSG) 94 is deposited by chemical vapor deposition. In the preferred embodiment, PSG 94 is deposited to a thickness of approximately 3000 angstroms. As is well known in the art, the use of a phosphorous doped oxide serves to stabilize mobile ion contaminants in integrated circuits: in the transistor of the preferred embodiment, a source of undesired mobile ions is the metallization, especially during metal etch. The phosphorous impurities in PSG 94 will getter, or trap, the undesired mobile ions, preventing the ions from diffusing to the active transistor areas and affecting the electrical characteristics of the transistor. However, phosphorous-doped oxide such as PSG 94 is a source of phosphorous ions which will form phosphoric acid in the presence of moisture. Phosphoric acid is corrosive to metal such as aluminum, especially in the presence of electrical bias. Accordingly, undoped oxide 96 is deposited by chemical vapor deposition, on top of PSG 94 as shown in FIG. 3. In the preferred embodiment, undoped oxide 96 is deposited to a thickness of approximately 18000 angstroms. As will be shown below, no aluminum or aluminum-alloy metallization will contact PSG 94, but is isolated from PSG 94 by undoped oxide 96.

Figure 4:
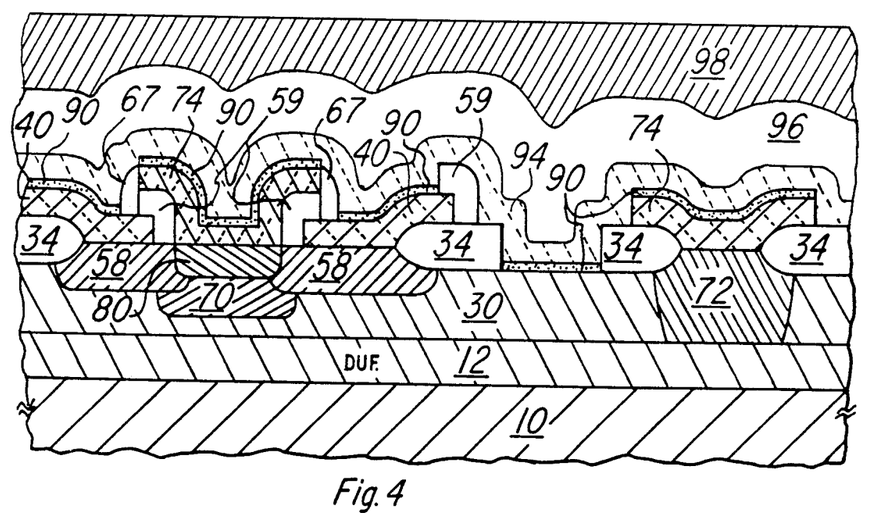
FIG. 4 is a cross-sectional view of the transistor of FIG. 3, after deposition of undoped silicon dioxide and after photoresist is spun onto the surface of the slice.
Figure 5:
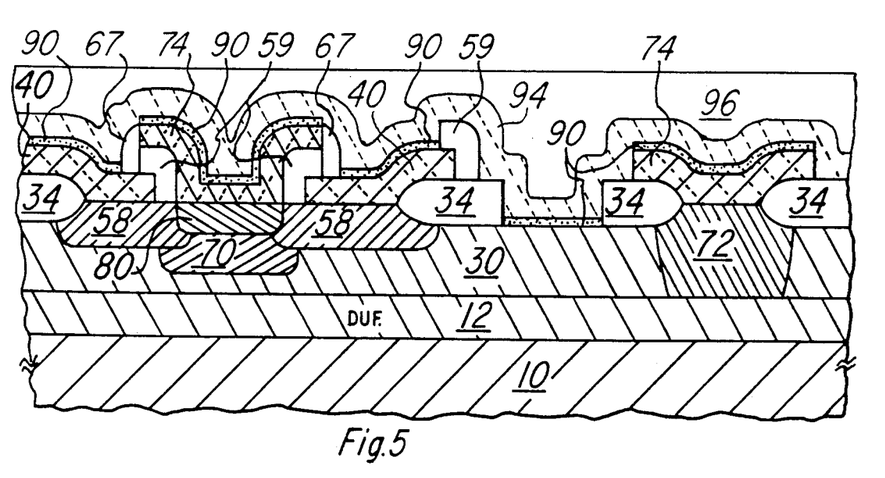
FIG. 5 is a cross-sectional view of the transistor of FIG. 4, after etching of the photoresist and undoped silicon dioxide.

The top surface of undoped oxide 96 is not a planar surface, however. As is evident from FIG. 3, if a metal layer were sputtered or evaporated onto undoped oxide 96, such a metal layer would have to cover steps in order to remain continuous. Referring now to FIGS. 4 and 5, the planarization of the surface of the semiconductor slice will be described. In FIG. 4, a layer of photoresist 98 is shown covering undoped oxide 96. Photoresist 98 is spun on to the slice, as is well known in the art, which serves to smooth out the top surface of photoresist 98 so that it is substantially planar. Photoresist 98 can be any well known photoresist, either negative or positive, and indeed need not be photo-sensitive at all, as no patterning or photolithography is required prior to etching. Photoresist 98 need only be some material which is conformal to the topology of the surface of the slice after deposition of undoped oxide 96, and which spins to, or otherwise arrives at, a substantially planar surface. In addition, the thickness of photoresist is not critical, since the minimum thickness is that which covers the highest peak of undoped oxide 96, and since the maximum thickness is limited only by the desired etch time. After photoresist 98 is spun on to the surface of the slice, the slice is exposed to a fluorinated plasma etch, which will etch away both photoresist 98 and also undoped oxide 96. The time of the etch may be predetermined so that the remaining thickness of undoped oxide remains above a desired minimum thickness: in the preferred embodiment, at least 2000 angstroms of undoped oxide 96 is desired in all locations of the slice. However, since the fluorinated plasma etch etches both photoresist 98 and undoped oxide 96 at approximately the same rate, the surface of undoped oxide 96 after this etch is much closer to being planar than after deposition. The absolute planarity will depend upon the similarity or difference in etch rates between photoresist 98 and undoped oxide 96. As is well known in the art, the concentration of oxygen in the plasma etch will control the selectivity of the etch to photoresist 98 and undoped oxide 96. Accordingly, by using well known techniques to properly control of the oxygen concentration depending upon the photoresist used, the surface of undoped oxide 96 after the etch can achieve substantial planarity.

Figure 6:
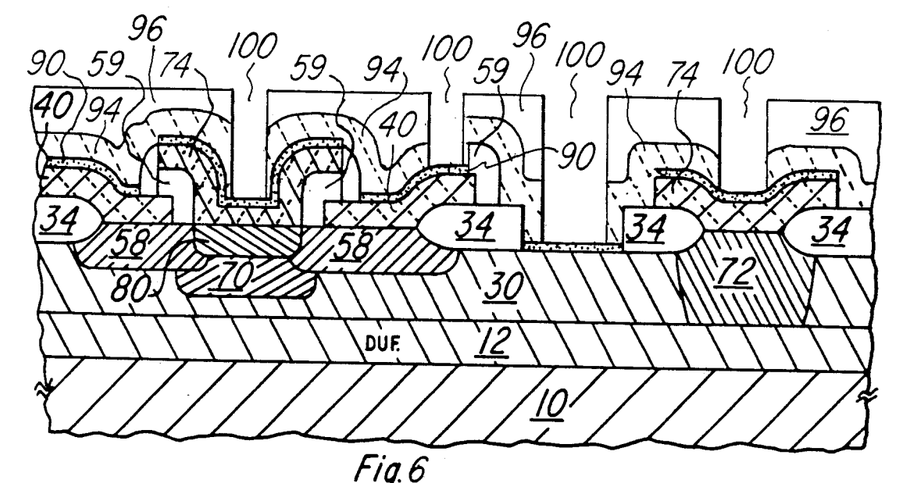
FIG. 6 is a cross-sectional view of the transistor of FIG. 5, after etching of contact vias.

Referring now to FIG. 6, the cross-section of the transistor according to the invention is shown with the contact vias etched. Positive photoresist (not shown) is deposited, patterned, and developed to the desired contact pattern using well-known photolithographic techniques. Contact vias 100 are etched by a fluorinated plasma etch; using well known techniques, contact vias 100 can be etched so that the sidewalls are substantially vertical. For example, the photolithography can be done with deep ultraviolet exposure of the photoresist, so that the developed resist is as stable as possible. Secondly, the oxygen concentration in the plasma chamber during etch is preferably minimized, so that erosion of the photoresist, and resultant rounding of contact vias 100, is minimized.

In this embodiment of the invention, however, contact vias 100 having substantially differing depths are required because of the planarization of undoped oxide 96. As is well known in the art, if undoped oxide presented a top surface which substantially follows the contours of the underlying layers, the thickness of undoped oxide 96 together with PSG 94 will be more or less constant over each of the underlying layers to which contact must be made. For example, the thickness of PSG 94 and undoped oxide 96 prior to planarization is substantially the same over first polysilicon layer 40 as it is over area 82 which makes up the Schottky barrier diode. Without planarization of the surface of undoped oxide 96, the depth of contact vias 100 would be approximately the same, regardless of which layer is to be contacted. However, referring to FIG. 6, it is apparent that a planar top surface of undoped oxide 96 requires that contact vias 100 have significantly differing depths. Without control of the etch process from such a topology, it is possible that first polysilicon layer 40 could be etched completely through before the contact via 100 for the Schottky barrier diode reaches the surface of area 82.

In the preferred embodiment, silicide film 90 acts as an etch stop at each of the contact locations at polysilicon layers 40 and 74, and at the contact at area 82 to the collector (epitaxial layer 30) which forms the Schottky barrier diode. In order to provide for the necessary selectivity ratio between the oxide and silicide film 90 so that the etch of contact vias 100 stops on silicide film 90, the oxygen concentration in the etch must be kept relatively low. In this embodiment of the invention, a desired selectivity ratio between the oxide and silicide film 90 is approximately 50:1. By way of example, the necessary selectivity is acheived in this embodiment of the invention by etching contact vias 100 with a fluorinated plasma etch having a gas composition of 85 ccm of $CHF_3$ (fluoroform), and 7 ccm of oxygen: the etch is done with a DC bias of 600 volts applied to the plasma, under a pressure of 45 millitorr. This etch mixture etches silicide film 90 at a rate six and one-fourth times slower than unclad polysilicon, which allows contact vias 100 to be etched to different depths. If a low oxygen fluorinated plasma etch and the silicide film 90 (as an etch stop) were not used, by the time that contact was made to collector region 30 for the Schottky barrier diode, first polysilicon layer 40 would be etched through, precluding a good ohmic contact to first polysilicon layer 40.

Figure 7:
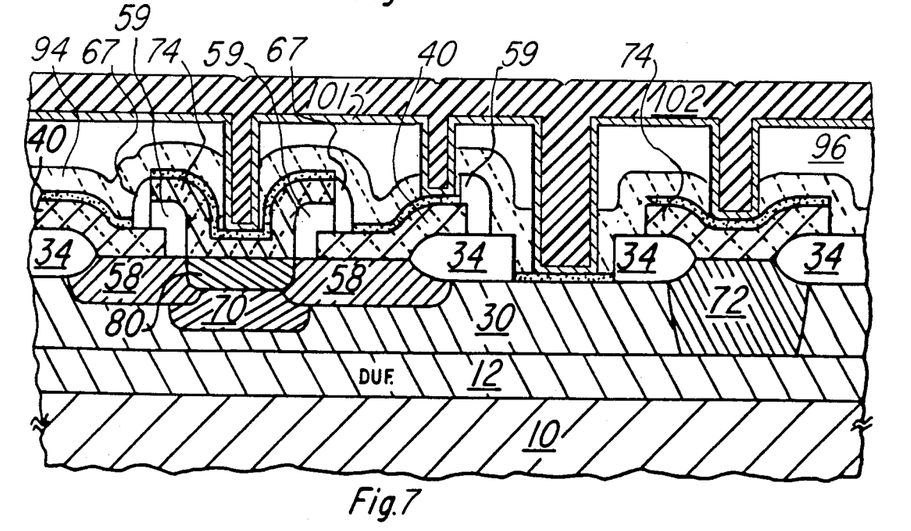
FIG. 7 is a cross-sectional view of the transistor of FIG. 6, after deposition of a titanium-tungsten metal film.

Referring now to FIG. 7, a thin layer 101 of metal is shown deposited on the slice after contact vias 100 are etched, with a thicker layer of refractory metal 102 deposited upon metal layer 101, refractory metal 102 serving to fill contact vias 100. The purpose of metal film 101 is to provide a proper adhesion surface for refractory metal 102, which will fill contact vias 100, and to provide good ohmic contact between refractory metal 102 and the underlying layer to which contact is to be made. In the preferred embodiment, metal film 101 is a titanium-tungsten alloy sputtered to a thickness of approximately 500 angstroms. Refractory metal 102 is tungsten, which is deposited by chemical vapor deposition to a thickness sufficient to fill contact vias 100. Contact vias 100 are preferably etched to a constant width, for example 1.5 microns, so that the "dimples" in the surface topology of refractory metal 102 are constant, and so that all of contact vias 100 fill at approximately the same time in the CVD of refractory metal 102. In addition, the small width of the contacts provides for dimples of minimum depth: this is not a critical factor in the overall planarization of the surface, however, since refractory metal 102 will also be planarized, prior to deposition of the metal lead. Refractory metal 102 consisting of tungsten, or of other refractory metals such as molybdenum, provides a good fill for contact vias 100, has a reduced tendency to electromigrate relative to aluminum, and provides good adhesion for aluminum and aluminum alloys. Refractory metal 102 has higher electrical resistivity than aluminum and aluminum alloys, however, which prevents its use as the sole metallization layer.

Similarly as described above relative to planarization of undoped oxide 96, refractory metal 102 is planarized by spinning photoresist (not shown) on the surface of the slice, followed by etching of the photoresist and refractory metal until the photoresist is consumed and until refractory metal 102 (and metal film 101) is reduced to a minimum thickness over oxide. The etchback is stopped prior to complete removal of refractory metal 102 (and metal layer 101) over oxide, though, so that the presence of refractory metal 102 in contact vias 100 will not "load" the local etch rates at the surface of the slice. The loading effect would occur if the metal films 101 and 102 were removed from the oxide because the surface area of the metal film exposed to the etch would reduce significantly, and would significantly increase the etch rate of refractory metal 102 in the area of contact vias 100. The loading effect is prevented so long as a finite thickness of metal film 101 and refractory metal 102 remains on the top of undoped oxide 96; a miminal thickness is preferred so that the final etch of refractory metal 102 and metal film 101 can be done in minimal time. The second photoresist etchback step results in further planarization of the surface of the slice prior to metalization.

It should be noted that a benefit of the process described herein, besides the excellent planarization, is the removal of parasitic Schottky barrier diodes by the use of refractory metal 102 in the contact to the Schottky barrier diode. Since the size of contact via 100 can be kept small, and since contact via 100 is patterned after silicide film 90 is deposited, contact via 100 can be easily placed within the area 82 of collector region 30 which receives silicide film 90, so that refractory metal 102 does not contact collector region 30, but instead only contacts silicide film 90. This prevents the fabrication of a tungsten or titanium-tungsten Schottky barrier diode in parallel with the desired platinum silicide Schottky barrier diode.

Figure 8:
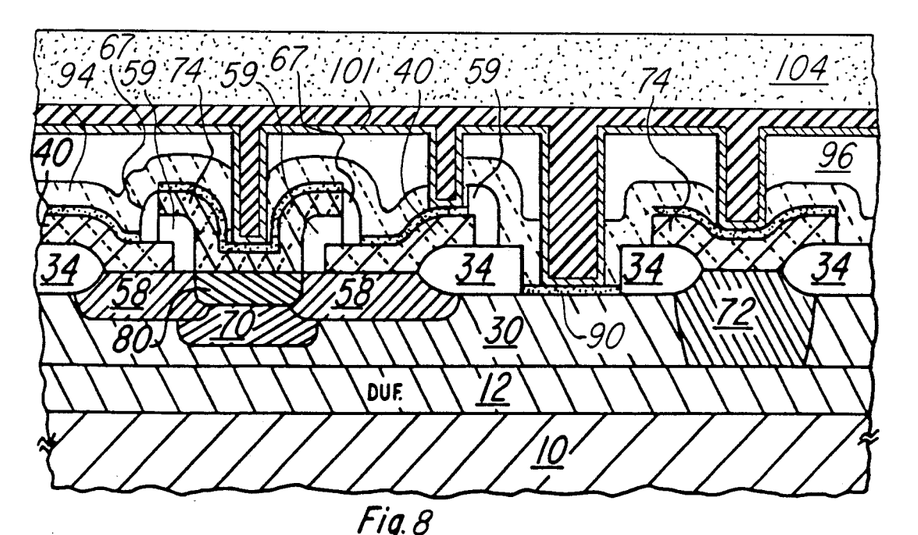
FIG. 8 is a cross-sectional view of the transistor of FIG. 7, after planarization of the titanium-tungsten film and after metal deposition.

After planarization of refractory metal 102, metallization layer 104 is now sputtered onto the surface of the slice. FIG. 8 illustrates metallization layer 104 deposited onto planarized refractory metal 102 and metal film 101. Metallization layer 104 can consist of pure aluminum, aluminum doped with silicon, or other well-known metallization materials. In the preferred embodiment, metallization layer 104 is composed of a 2% mixture of copper in pure aluminum, and is sputtered to a thickness of 7500 angstroms. Metallization layer 104 is patterned, and is etched by a chlorinated plasma etch. The etch process stops upon removal of all of the unmasked metallization layer 104, as refractory metal 102 is not vulnerable to the chlorinated plasma etch. The etch of metallization layer 104 can be done at a high etch rate without fear of mobile ion contamination, due to the presence of PSG 94, as discussed above. The residual refractory metal 102 and metal film 101 left on undoped oxide 96 is then cleared by a fluorinated plasma etch, stopping upon reaching undoped oxide 96, not disturbing PSG layer 94 beneath undoped oxide 96. This of course provides electrical isolation between the remaining leads of metallization layer 104, as shown in FIG. 9.

Figure 9:
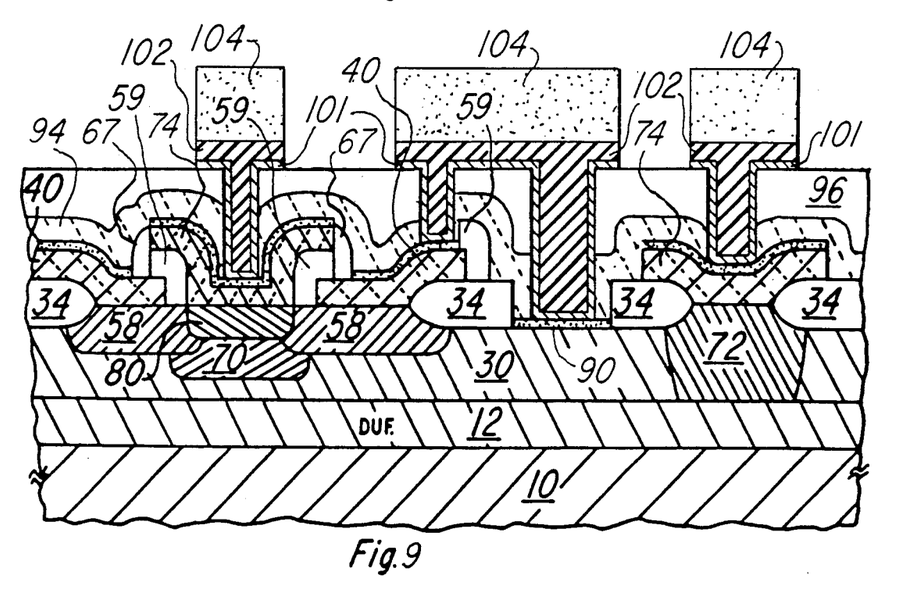
FIG. 9 is a cross-sectional view of the transistor of FIG. 8, after metal etch.
Figure 10:
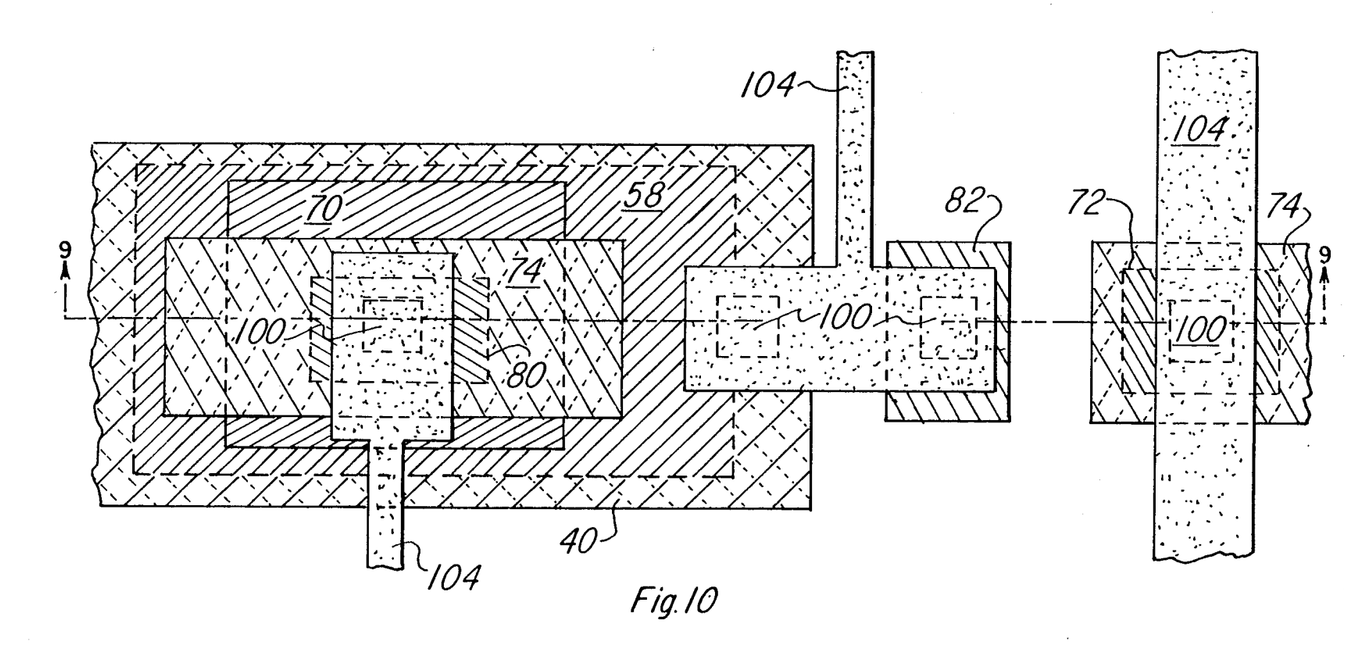
FIG. 10 is a plan view of the transistor of FIG. 9.

The finished transistor of FIG. 9 is shown in a plan view in FIG. 10; for clarity, only the active areas (other than epitaxial layer 30) are illustrated. The position of contact vias 100 are shown as dashed lines because no steps exist at the edges of contact vias 100 (see FIG. 9), so the presence or absence of contact vias 100 is not visible through metallization layer 104. Generally a passivation layer is deposited on the surface of the slice after metal etch, for protection of the metallization layer 104 from mechanical damage and from corrosive environments. Additional metal interconnection layers may of course also be added to the cross-section shown in FIG. 9, depending upon the layout of the desired circuit.

It should be noted that step coverage of metallization layer 104 in practice is approximately 95% (less than 5% thinning) using the above-described method, which reduces the propensity for electromigration failures at the steps accordingly. The layout engineer now must only provide for an additional 5% width of the metal line to account for metallization thinning, rather than the 50% assumption used in the layout of integrated circuits having typical topology. It should also be noted that because PSG layer 94 does not contact metallization layer 104, aluminum can be used to provide the desired electrical conductivity of metallization 104 without fear of corrosion from phosphorous ions in PSG layer 94.

While the invention has been described with reference to its preferred embodiment, it is of course understood that modifications to this embodiment, and alternative embodiments, may be made by those of ordinary skill in the art without departing from the spirit and scope of this invention as hereinbelow claimed. Specifically, it is of course understood that the invention may be equally applied to integrated circuits fabricated with other technologies, such as metal-oxide-semiconductor technology, while remaining within the spirit and scope of the invention as claimed below.

We claim:

1. A method for fabricating an integrated circuit on a semiconductor chip, comprising:
   forming a conductive interconnection layer comprised of silicon;
   forming a silicide film on the surface of said conductive layer;
   depositing a dielectric film covering said conductive layer;
   etching said dielectric film so that selected locations of said silicide film on said conductive layer are exposed; and
   depositing a metal interconnection layer.

2. The method of claim 1, wherein the step of forming a conductive interconnection layer comprises:
   depositing a layer of polysilicon; and
   etching selected portions of said polysilicon layer to create an interconnection pattern.

3. The method of claim 1, further comprising:
   doping a selected area of the substrate of said semiconductor chip, prior to the step of forming said conductive interconnection layer.

4. The method of claim 3, further comprising:
   forming an isolation dielectric film over said doped area of said substrate;
   etching said isolation dielectric film to expose a selected area of said doped area; and
   forming a silicide film on said exposed area of said doped area;
   wherein said step of etching said dielectric film also exposes a portion of the silicide film on said doped area.

5. The method of claim 4, wherein said step of forming said isolation dielectric film comprises:
   growing a film of silicon dioxide.

6. The method of claim 1, wherein said step of forming a silicide film comprises:
   depositing a layer of a metal; and
   heating the semiconductor chip to form the silicide film.

7. The method of claim 6, wherein the deposited metal is platinum.

8. The method of claim 1, wherein the step of etching the dielectric film comprises:
   forming a masking layer on the surface of said dielectric film in those locations where the dielectric film is not to be etched; and
   exposing the masking layer and the dielectric film to an etchant until the selected portions of said silicide film are exposed.

9. The method of claim 8, wherein the etchant is a gaseous mixture comprising:
   a fluoride gas; and
   oxygen;
   and wherein the concentration of oxygen is less than the concentration of the fluoride gas.

10. The method of claim 6, wherein the step of etching the dielectric film comprises:
    forming a masking layer on the surface of said dielectric film in those locations where the dielectric film is not to be etched; and
    exposing the masking layer and the dielectric film to an etchant until the selected portions of said silicide film are exposed.

11. The method of claim 10, wherein the etchant is a gaseous mixture comprising:
    a fluoride gas; and
    oxygen:
    and wherein the concentration of oxygen is less than the concentration of the fluoride gas.

12. A method of making electrical connection between conductive layers on a semiconductor chip, comprising:
    depositing a first conductive layer on selected areas of said semiconductor chip, said first conductive layer comprising silicon;
    depositing a first dielectric film covering said first conductive layer;
    depositing a second conductive layer of silicon on selected areas of said semiconductor chip, said second conductive layer comprising silicon;
    removing selected portions of said first dielectric layer to expose portions of said first conductive layer;
    forming a silicide film on the exposed portions of said first conductive layer and said second conductive layer;
    depositing a second dielectric film;
    etching said second dielectric film to expose selected portions of said silicide film on said first dielectric layer and said second dielectric layer; and
    depositing a metal interconnection layer on said second dielectric film so that said metal interconnection layer makes contact to said exposed portions of said silicide film.

13. The method of claim 12, further comprising:
    depositing a third dielectric layer on said second conductive layer; and
    prior to the step of forming the silicide film, etching said third dielectric layer to expose the top surface of said second conductive layer, so that sidewall spacers of said third dielectric layer remain at the edges of said second conductive layer.

14. The method of claim 13, wherein the step of etching the second dielectric film comprises:
    forming a masking layer on the surface of said second dielectric film in those locations where the second dielectric film is not to be etched; and
    exposing the masking layer and the second dielectric film to an etchant until the selected portions of said silicide film are exposed.

15. The method of claim 14, wherein the etchant is a gaseous mixture comprising:
    a fluoride gas; and
    oxygen;
    wherein the concentration of oxygen is less than the concentration of the fluoride gas.

16. The method of claim 15, wherein said exposed portions of said silicide film are of equal width.

17. The method of claim 12, wherein the step of depositing a metal interconnection layer comprises:
    depositing a refractory metal, said refractory metal substantially filling the etched portions of said second dielectric film;
    depositing a metal layer on said refractory metal, said metal layer comprising aluminum; and
    etching selected portions of said metal layer and said refractory metal, so that an interconnection pattern remains.

* * * * *